(12) United States Patent
Zhu et al.

(10) Patent No.: US 7,790,553 B2
(45) Date of Patent: Sep. 7, 2010

(54) METHODS FOR FORMING HIGH PERFORMANCE GATES AND STRUCTURES THEREOF

(75) Inventors: Huilong Zhu, Poughkeepsie, NY (US); Xiaomeng Chen, Poughkeepsie, NY (US); Mahender Kumar, Fishkill, NY (US); Brian J. Greene, Wappingers Falls, NY (US); Bachir Dirahoui, Bedford Hills, NY (US); Jay W. Strane, Warwick, NY (US); Gregory G. Freeman, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 95 days.

(21) Appl. No.: 12/170,687

(22) Filed: Jul. 10, 2008

(65) Prior Publication Data

US 2010/0006926 A1    Jan. 14, 2010

(51) Int. Cl.
*H01L 21/8234* (2006.01)
(52) U.S. Cl. ............... 438/275; 438/276; 438/289
(58) Field of Classification Search ............... None
See application file for complete search history.

(56) References Cited

U.S. PATENT DOCUMENTS

| | | | |
|---|---|---|---|
| 6,355,531 B1 * | 3/2002 | Mandelman et al. | 438/276 |
| 6,645,818 B1 * | 11/2003 | Sing et al. | 438/275 |
| 6,897,095 B1 * | 5/2005 | Adetutu et al. | 438/119 |
| 7,445,981 B1 * | 11/2008 | Karve et al. | 438/199 |
| 7,595,243 B1 * | 9/2009 | Bulucea et al. | 438/276 |
| 2002/0055224 A1 | 5/2002 | Mandelman et al. | |
| 2004/0171222 A1 | 9/2004 | Gao et al. | |
| 2004/0238859 A1 | 12/2004 | Polishchuk et al. | |
| 2009/0230463 A1 * | 9/2009 | Carter et al. | 257/327 |

\* cited by examiner

*Primary Examiner*—Zandra Smith
*Assistant Examiner*—Khanh B Duong
(74) *Attorney, Agent, or Firm*—Joseph Petrokaitis; Hoffman Warnick LLC

(57) ABSTRACT

Methods for forming high performance gates in MOSFETs and structures thereof are disclosed. One embodiment includes a method including providing a substrate including a first short channel active region, a second short channel active region and a long channel active region, each active region separated from another by a shallow trench isolation (STI); and forming a field effect transistor (FET) with a polysilicon gate over the long channel active region, a first dual metal gate FET having a first work function adjusting material over the first short channel active region and a second dual metal gate FET having a second work function adjusting material over the second short channel active region, wherein the first and second work function adjusting materials are different.

14 Claims, 6 Drawing Sheets

METHODS FOR FORMING HIGH PERFORMANCE GATES AND STRUCTURES THEREOF

BACKGROUND

1. Technical Field

The disclosure relates generally to use of different metal-dielectric combination for controlling threshold voltages in high performance metal oxide semiconductor field effect transistor (MOSFETs).

2. Background Art

Polycrystalline silicon (Poly-Si) is widely used in the fabrication of complimentary metal oxide semiconductor (CMOS) transistors. However, continued scaling of device channels requires reduction in capacitance equivalent thickness (CET) and reduction in threshold voltages ($V_t$) in MOSFETs. Poly-Si as a gate material in MOSFETs presents a limitation in the reduction in CET because of dopant depletion.

To overcome the limitations of poly-Si as a gate material, one alternative is to replace poly-Si gate material with metal. The use of different combinations of metal and dielectric materials provides control over $V_t$ where the selected gate materials dictate the work function of the gate. Poly-Si is preferred for long channel gates since it is easy to obtain $V_t$ control, while dual metal alloy and dielectric materials for short channel CMOS devices is preferred due to a high performance requirement.

SUMMARY

Methods for forming high performance gates in MOSFETs and structures thereof are disclosed. One embodiment includes a method including providing a substrate including a first short channel active region, a second short channel active region and a long channel active region, each active region separated from another by a trench isolation; and forming a field effect transistor (FET) with a polysilicon gate over the long channel active region, a first dual metal gate FET having a first work function adjusting material over the first short channel active region and a second dual metal gate FET having a second work function adjusting material over the second short channel active region, wherein the first and second work function adjusting materials are different.

A first aspect of the disclosure provides a method comprising: providing a substrate including a first short channel active region, a second short channel active region and a long channel active region, each active region separated from another by a trench isolation; and forming a field effect transistor (FET) with a polysilicon gate over the long channel active region, a first dual metal gate FET having a first work function adjusting material over the first short channel active region and a second dual metal gate FET having a second work function adjusting material over the second short channel active region, wherein the first and second work function adjusting materials are different.

A second aspect of the disclosure provides an integrated circuit (IC) chip comprising: a field effect transistor (FET) with a polysilicon gate over a long channel active region; a first dual metal gate FET having a first work function adjusting material over a first short channel active region; and a second dual metal gate FET having a second work function adjusting material over a second short channel active region, wherein the first and second work function adjusting materials are different.

A third aspect of the disclosure provides a method comprising: providing a substrate including a first short channel active region, a second short channel active region and a long channel active region, each active region separated from another by a shallow trench isolation (STI); forming a first gate dielectric layer and a polysilicon layer over the long channel active region only; depositing a second gate dielectric layer onto the first and second short channel active regions; depositing a first work function adjusting material and a first metal over the substrate; removing the second gate dielectric layer, the first work function adjusting material and the first metal from a selected one of the short channel active regions; depositing a third gate dielectric layer onto the selected one of the short channel active regions; depositing a second work function adjusting material and a second metal over the substrate; removing the third gate dielectric layer, the second work function adjusting material and the second metal over at least the long channel active region and a portion of the first short channel active region; depositing polysilicon over the substrate; and forming a gate structure for each the first and second short channel regions and the long channel region, resulting in a field effect transistor (FET) with a polysilicon gate over the long channel active region, a first dual metal gate FET having the first work function adjusting material over the first short channel active region and a second dual metal gate FET having the second work function adjusting material over the second short channel active region, wherein the first and second work function adjusting materials are different.

These and other features of the present disclosure are designed to solve the problems herein described and/or other problems not discussed.

BRIEF DESCRIPTION OF THE DRAWINGS

Various aspects of the disclosure will be more readily understood from the following detailed description taken in conjunction with the accompanying drawings that depict different embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
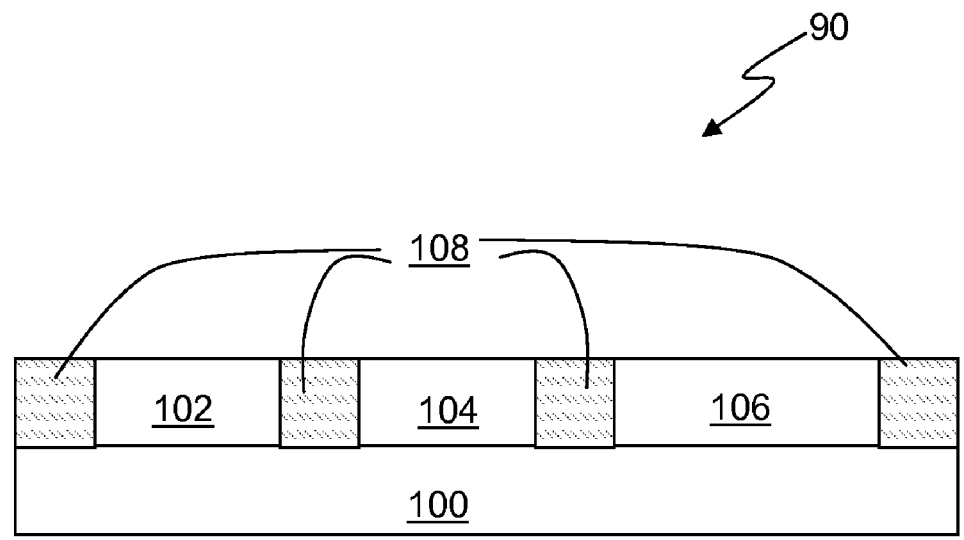
FIGS. 1-11 are cross-sectional views of embodiments of a semiconductor structure fabricated according to methods of the disclosure illustrated in FIG. 1.

Embodiments depicted in the drawings in FIGS. 1-14 illustrate the methods and various resulting structures. In one embodiment, shown in FIGS. 11 and 14, the resulting structure includes an IC chip 8 having a field effect transistor (FET) 10 with a polysilicon gate 112 over a long channel active region 106. In addition, the IC chip may include a first dual metal gate FET 16 having a first work function adjusting material 120 over a first short channel active region 102, and a second dual metal gate FET 20 having a second work function adjusting material 124 over a second short channel active region 104. The first and second work function adjusting materials 120, 124 are different.

FIG. 1 illustrates an initial process according to an embodiment of a method of the disclosure. In particular, FIG. 1 illustrates providing an initial semiconductor structure 90 with a substrate 100 on which first and second short active regions 102, 104 and a long channel active region 106 are formed. Substrate 100 may take a semiconductor-on-insulator or bulk silicon form. Each active region 102,104, 106 may be formed using currently known or later developed techniques. Active regions 102, 104 and 106 are interspersed with shallow trench isolations (STI) 108.

FIGS. 2-11 show forming FET 10 with polysilicon gate 112 over long channel active region 106. In addition, FIGS. 2-11 show forming first dual metal gate FET 16 having first work function adjusting material 120 over first short channel active region 102, and second dual metal gate FET 20 having second work function adjusting material 124 over second short channel active region 104. The FET forming, as will be described herein, may include forming a first stack 136 including a first gate dielectric layer and a polysilicon layer over the long channel active region 106 only, forming a second stack 132 including a second gate dielectric layer, first work function adjusting material 120 and a first metal over first short channel active region 102; and forming a third stack 134 including a third gate dielectric layer, second work function adjusting material 124 and a second metal over second short channel active region 104.

Figure 2:
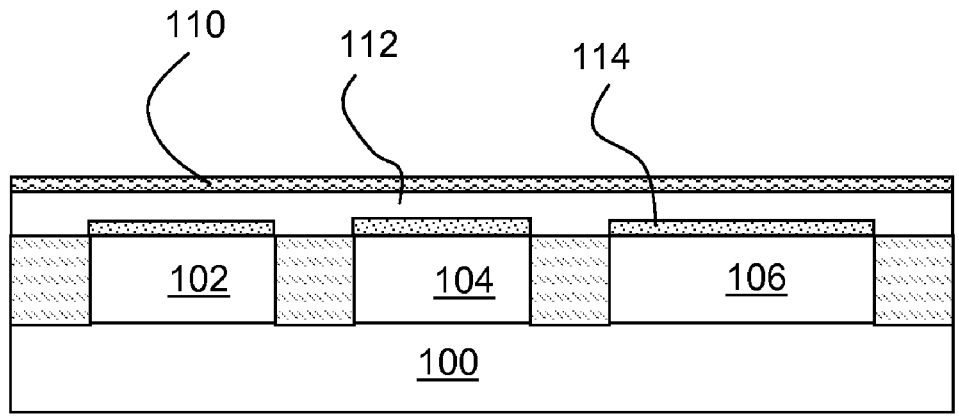
Figure 3:
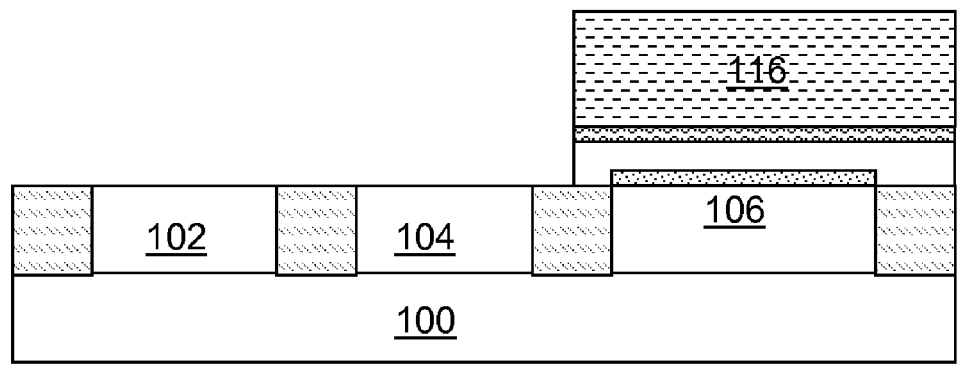

FIGS. 2-3 shows forming a first gate dielectric layer 114 (e.g., silicon oxide) and a polysilicon layer 112 over long channel active region 106 only. As shown in FIG. 2, this process may include depositing first gate dielectric layer 114 on active regions 102, 104 and 106 and depositing polysilicon layer 112 over substrate 100. In an optional embodiment, a protective layer 110 may also be deposited over polysilicon layer 112. In one embodiment, first gate dielectric layer 114 includes about 1-5 nanometers (nm) of silicon oxide, polysilicon layer 112 is about 5-20 nm, and protective layer 110 includes about 5-10 nm of silicon nitride ($Si_3N_4$). However, other materials and thicknesses may also be possible.

As shown in FIG. 3, using currently known or later developed techniques, a resist 116 is formed over protective layer 110 above long channel active region 106. Then, any exposed gate dielectric layer 114, polysilicon layer 112, and protective layer 110 is removed using currently known or later developed etching techniques, for example, but not limited to reactive ion etching (RIE). Following the etching process, resist 116 is removed.

Figure 4:
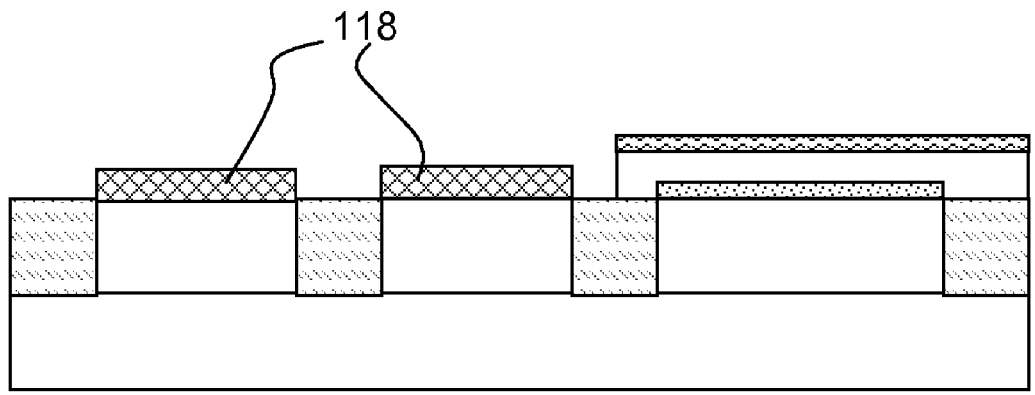

FIG. 4 shows depositing a second gate dielectric layer 118 over first short channel active region 102 and second channel active region 104. In one embodiment, second gate dielectric layer 118 may include area selective atomic layer deposited hafnium oxide ($HfO_2$), zirconium oxide ($ZrO_2$), aluminum oxide ($Al_2O_3$), titanium oxide ($TiO_2$), lanthanum oxide ($La_2O_3$), strontium-titanium oxide ($SrTiO_3$), lanthanum aluminum oxide ($LaAlO_3$) or mixtures thereof. The thickness may be about 2-5 nm. However, the material, deposition technique and thickness may vary.

Figure 5:
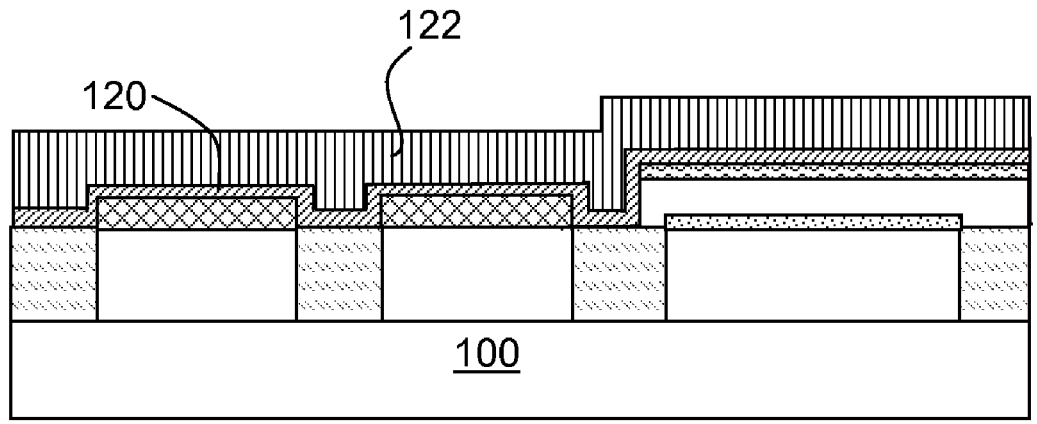
Figure 6:
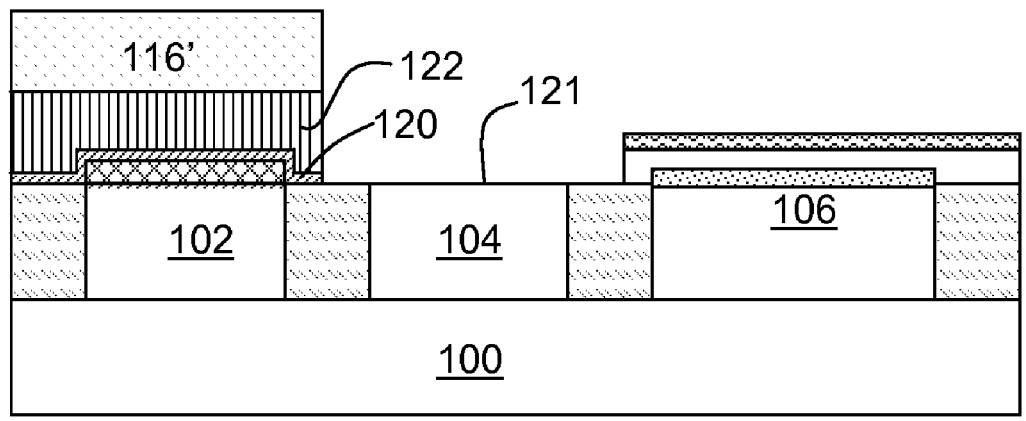

FIG. 5 shows depositing first work function adjusting material 120 and first metal 122 over substrate 100. First work function adjusting material 120 may include, in one embodiment, about 0.1-0.2 nm of lanthanum oxide ($La_2O_3$) and first metal may include about 5-20 nm of titanium nitride (TiN), tantalum nitride (TaN), tantalum aluminum nitride (TaAlN) or mixtures thereof where an n-type FET (NFET) is to be built over first short channel active region 102. Other work function adjusting material, metal and thicknesses may be employed, as will be described herein, especially when other type devices are to be generated FIG. 6 shows removing second gate dielectric layer 118, first work function adjusting material 120 and first metal 122 from a selected one of short channel active regions 102, 104. In FIG. 6, the material is removed from region 104. This process may include forming a resist 116' (FIG. 7) over metal 122 above first short channel active region 102, etching (e.g., RIE) gate dielectric layer 118 (FIG. 4), work function adjusting material 120 over second short channel active region 104; and removing resist 116' thereafter.

Figure 7:
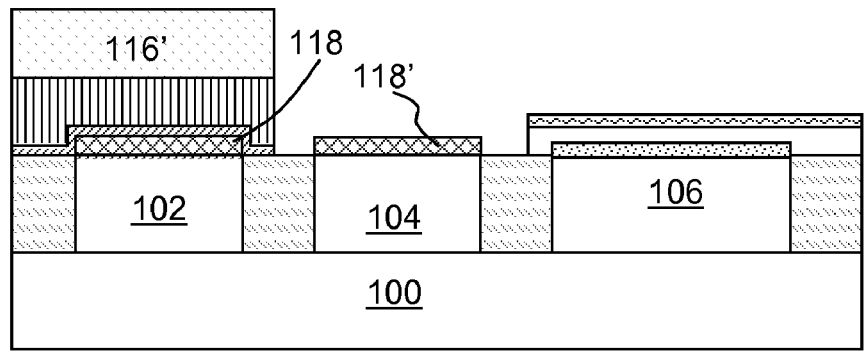

FIG. 7 shows depositing a third gate dielectric layer 118' onto second short channel active region 104. Gate dielectric layer 118' may include, for example, hafnium oxide ($HfO_2$), zirconium oxide ($ZrO_2$), aluminum oxide ($Al_2O_3$), titanium oxide ($TiO_2$), lanthanum oxide ($La_2O_3$), strontium-titanium oxide ($SrTiO_3$), lanthanum aluminum oxide ($LaAlO_3$) or mixtures thereof having a thickness of about 2-5 nm deposited via area selective ALD.

Figure 8:
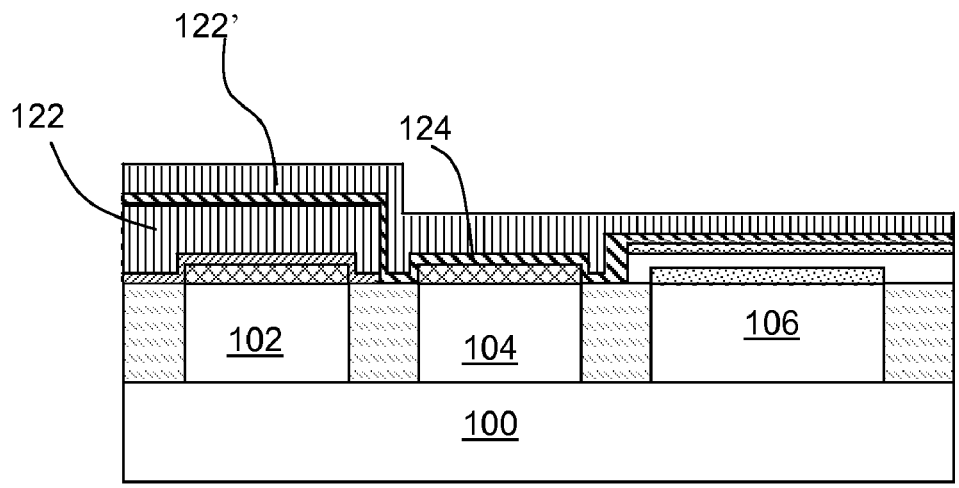

FIG. 8 shows depositing second work function adjusting material 124 and second metal 122' over substrate 100. Second work function adjusting material 124 may include aluminum oxide ($Al_2O_3$) and second metal 122' may include titanium nitride (TiN), tantalum nitride (TaN), tantalum aluminum nitride (TaAlN) and mixtures thereof, for example, where a p-type FET (PFET) is to be formed over second short channel active region 104.

Figure 9:
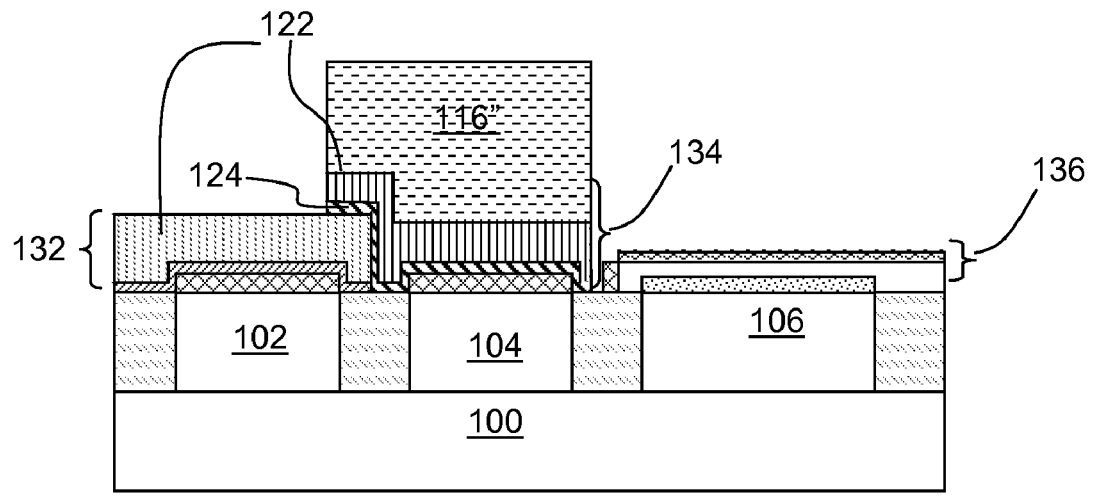
Figure 10:
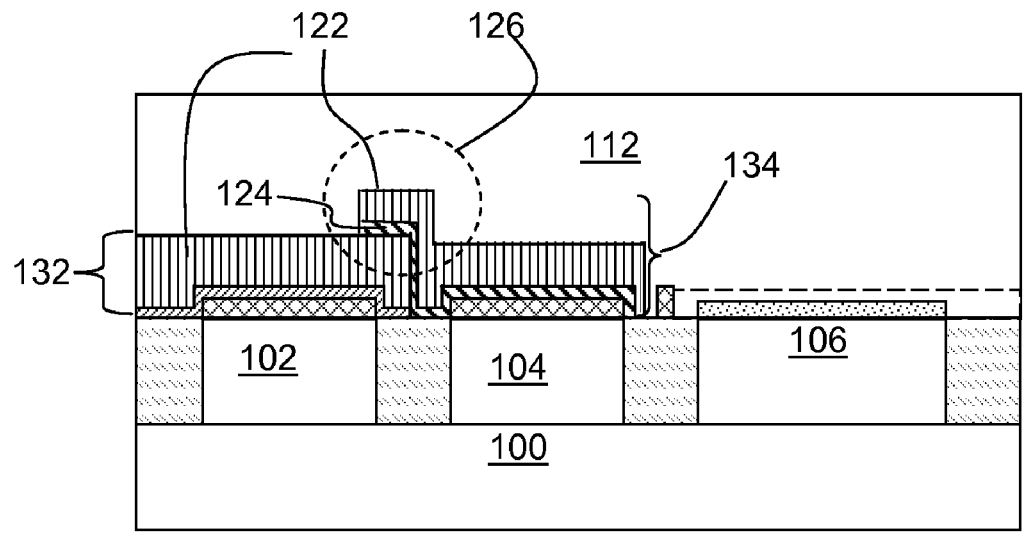
Figure 11:
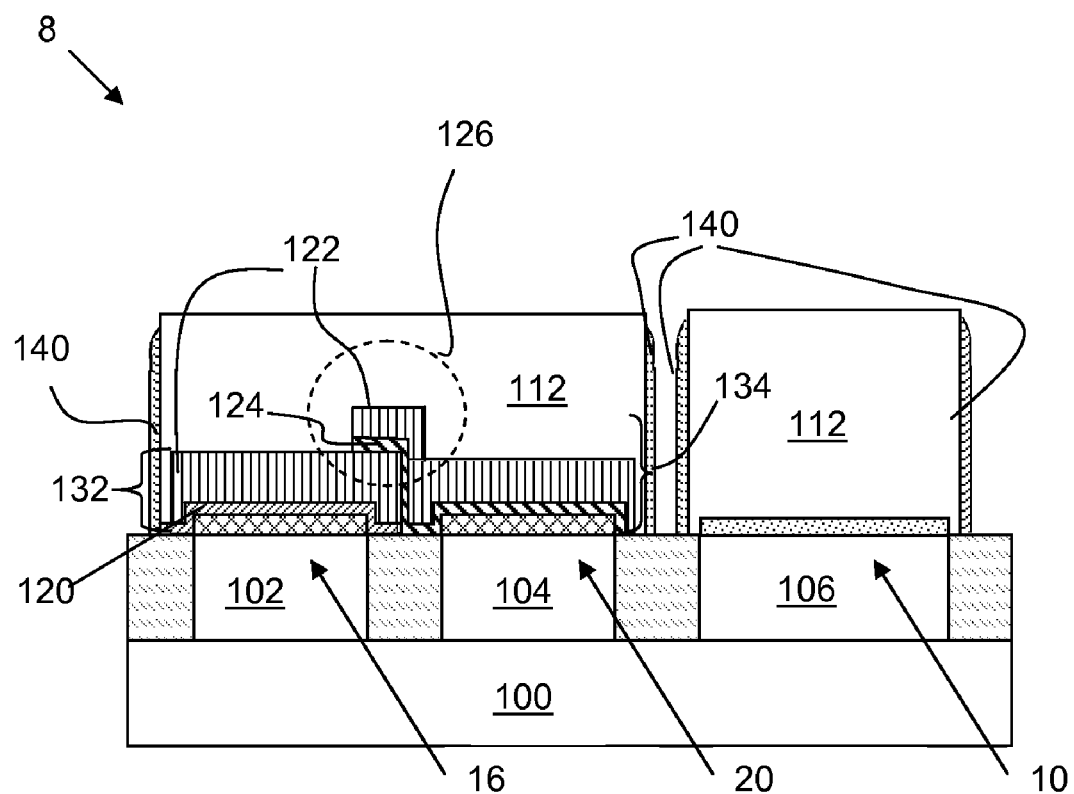

FIG. 9 shows removing second work function adjusting material 124 and second metal 122' over at least long channel active region 106 and a portion of first short channel active region 102. This process may include forming a resist 116" over second short channel active region 104, and etching (e.g., RIE) second work function adjusting material 124 and second metal 122'. Consequently, a first stack 132, a second stack 134 and a third stack 136 are formed. Depending on the position of resist 116" formed over second short channel active region 104, second stack 134 may overlap (FIGS. 10-11) first stack 132. That is, as shown in FIGS. 10-11, in one embodiment, a portion of second work function adjusting material 124 remains overlapping 126 first stack 132, i.e., first short channel active region 102, first work function adjusting material 120, first metal 122 and second gate dielectric layer 118. In an alternative embodiment, shown in FIGS. 12-14, second stack 134 may underlap 128 first stack 132.

Returning to FIGS. 10-11, further processing may include depositing polysilicon layer 112 over substrate 100. Protective layer 110 (FIG. 2) would be removed prior to depositing layer 112. FIG. 11 shows forming a gate structure for each of the first and second short channel active regions 102, 104 and long channel active region 106 from first stack 132, second stack 134 and third stack 136, respectively, where each stack now includes polysilicon layer 112. As shown, in one embodiment, first and second dual metal FETs 16 and 20 may share polysilicon layer 112. The gate structure forming may include any now known or later developed techniques such as patterning a gate from the first and second stacks 132, 134 and third stack 136, implanting dopants to form source/drain regions, forming spacers 140 about each gate and annealing. As shown in FIGS. 10-11, an overlap 126 of second stack 134 over first stack 132 remains.

Figure 12:
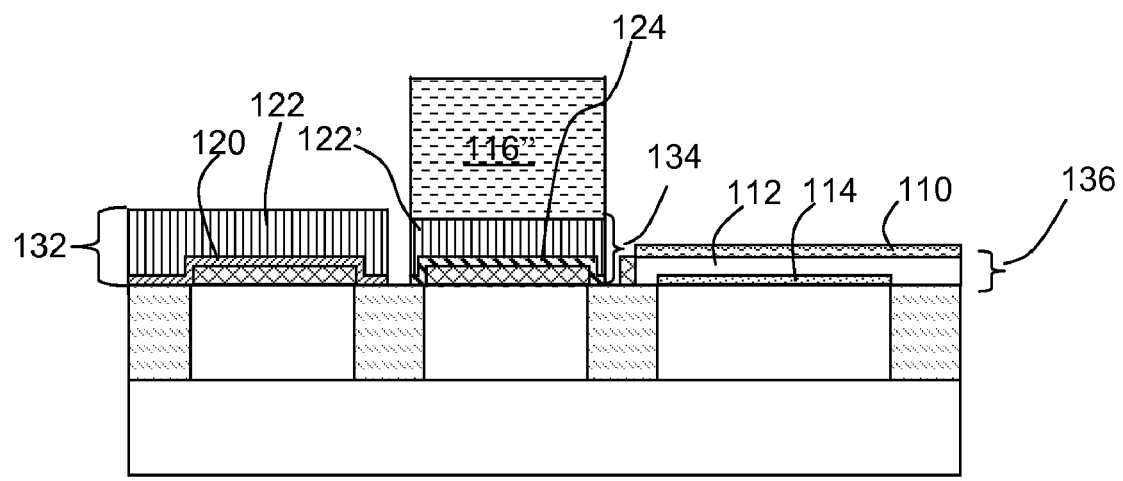
FIGS. 12-14 are cross-sectional views of alternative embodiment(s) of the semiconductor structure fabricated according to the methods of the disclosure.
Figure 13:
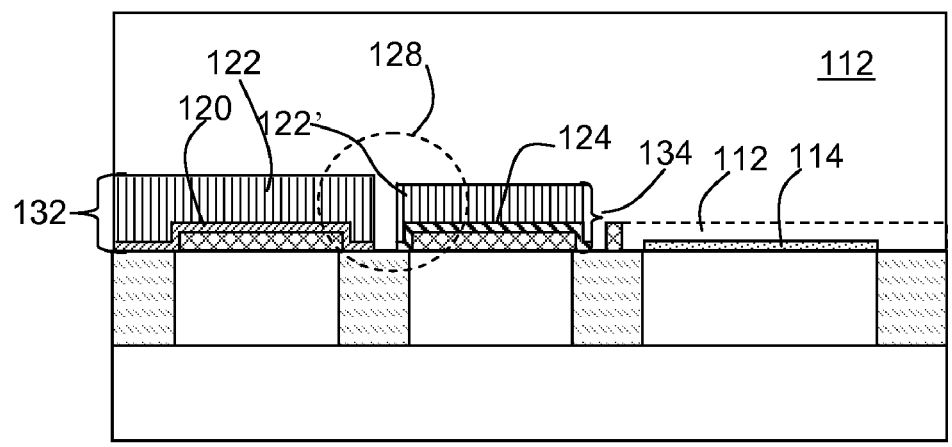
Figure 14:
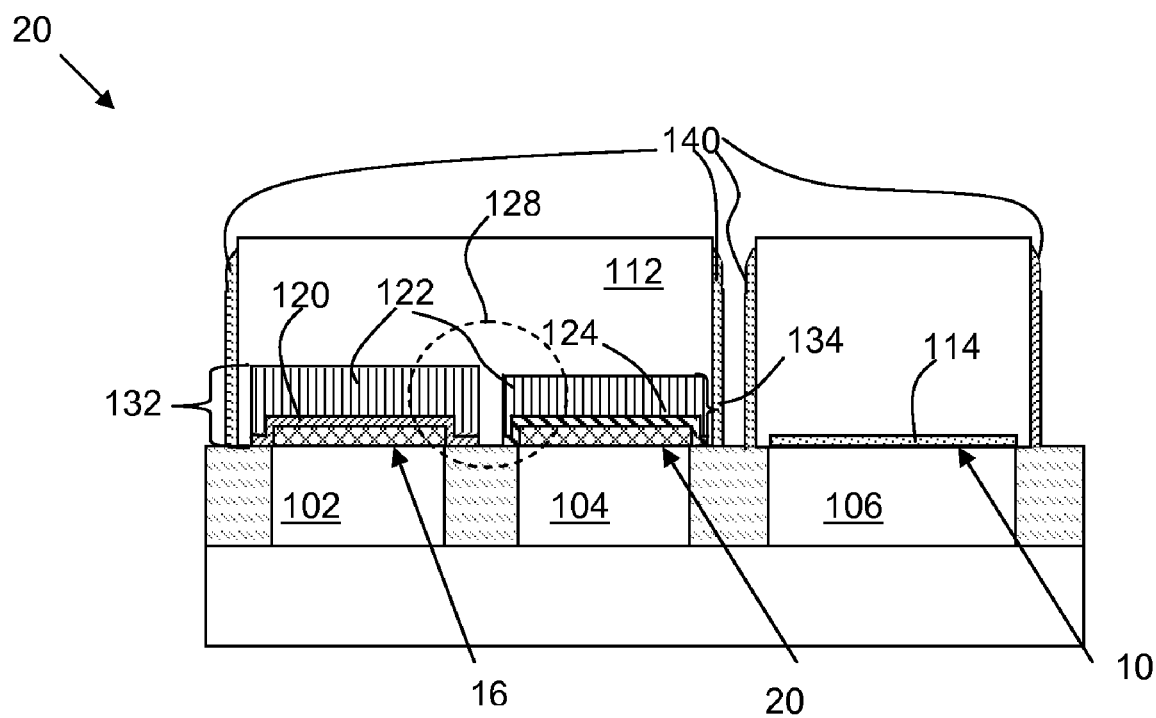

FIGS. 12-14 illustrate alternative embodiments that produce an alternative IC chip. In this case, as shown in FIG. 12, resist 116" is narrower such that second work function adjusting material 124 and second metal 122' are removed from over first stack 132 during etching thereof. Hence, material 124 and metal 122' are removed from over long channel active region 106 and all of first short channel active region 102. This process results in no overlap (underlap) between second stack 134 and first stack 132, resulting in a gap 128.

Note, FIGS. 11 and 14 show the cross-sections along gates or the cross-sections cutting through the gates in the direction vertical to the source and drain of FETs.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing drawings show some of the processing associated according to several embodiments of this disclosure. In this regard, each drawing or block within a flow diagram of the drawings represents a process associated with embodiments of the method described. It should also be noted that in some alternative implementations, the acts noted in the drawings or blocks may occur out of the order noted in the figure or, for example, may in fact be executed substantially concurrently or in the reverse order, depending upon the act involved. Also, one of ordinary skill in the art will recognize that additional blocks that describe the processing may be added.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
    providing a substrate including a first short channel active region, a second short channel active region and a long channel active region, each active region separated from another by a trench isolation;
    forming a field effect transistor (FET) with a polysilicon gate over the long channel active region, a first dual metal gate FET having a first work function adjusting material over the first short channel active region and a second dual metal gate FET having a second work function adjusting material over the second short channel active region, wherein the first and second work function adjusting materials are different, wherein the forming a FET includes:
    forming a first stack including a first gate dielectric layer and a polysilicon layer over the long channel region only,
    forming a second stack including a second gate dielectric layer, the first work function adjusting material and a first metal over the first short channel active region;
    forming a third stack including a third gate dielectric layer, the second work function adjusting material and a second metal over the second short channel active region;
    depositing polysilicon over the substrate; and
    forming a gate structure for each of the first and second short channel regions and the long channel region from the first, third and second stacks and the polysilicon.

2. The method of claim 1, wherein the gate structure forming includes patterning a gate from each of the first, second and third stacks, implanting dopants to form source/drain regions, forming spacers about each gate and annealing.

3. The method of claim 1, wherein the second and third gate dielectric layer include hafnium oxide ($HfO_2$), zirconium oxide ($ZrO_2$), aluminum oxide ($Al_2O_3$), titanium oxide ($TiO_2$), lanthanum oxide ($La_2O_3$), strontium-titanium oxide ($SrTiO_3$), lanthanum aluminum oxide ($LaAlO_3$) and mixtures thereof.

4. The method of claim 1, wherein the first metal and the second metal are selected from the group consisting of titanium nitride (TiN), tantalum nitride (TaN), tantalum aluminum nitride (TaAlN) and mixtures thereof.

5. The method of claim 1, wherein the first, second and third stack forming includes:
    forming the first gate dielectric layer and the polysilicon layer over the long channel active region only;
    depositing the second gate dielectric layer onto the first and second short channel active regions;
    depositing the first work function adjusting material and the first metal over the substrate;
    removing the second gate dielectric layer, the first work function adjusting material and the first metal from a selected one of the short channel active regions;
    depositing the third gate dielectric layer onto the selected one of the short channel active regions;
    depositing the second work function adjusting material and the second metal over the substrate; and
    removing the second work function adjusting material and the second metal except over the selected one of the short channel active regions.

6. The method of claim 1, wherein the first stack forming further includes depositing a protective layer over the polysilicon layer in the first stack, and further comprising removing the protective layer prior to depositing the polysilicon.

7. The method of claim 1, wherein the first dual metal gate FET includes an n-type FET, and wherein the first work function adjusting material includes lanthanum oxide.

8. The method of claim 1, wherein the second dual metal gate FET includes a p-type FET, and wherein the second work function adjusting material includes aluminum oxide.

9. A method comprising:
    providing a substrate including a first short channel active region, a second short channel active region and a long channel active region, each active region separated from another by a shallow trench isolation (STI);

forming a first gate dielectric layer and a polysilicon layer over the long channel active region only;

depositing a second gate dielectric layer onto the first and second short channel active regions;

depositing a first work function adjusting material and a first metal over the substrate;

removing the second gate dielectric layer, the first work function adjusting material and the first metal from a selected one of the short channel active regions;

depositing a third gate dielectric layer onto the selected one of the short channel active regions;

depositing a second work function adjusting material and a second metal over the substrate;

removing the second work function adjusting material and the second metal over at least the long channel active region and a portion of the first short channel active region;

depositing polysilicon over the substrate; and forming a gate structure for each the first and second short channel regions and the long channel region, resulting in a field effect transistor (FET) with a polysilicon gate over the long channel active region, a first dual metal gate FET having the first work function adjusting material over the first short channel active region and a second dual metal gate FET having the second work function adjusting material over the second short channel active region, wherein the first and second work function adjusting materials are different.

10. The method of claim 9, wherein the gate structure forming includes patterning a gate for each FET, implanting dopants to form source/drain regions, forming spacers about each gate and annealing.

11. The method of claim 9, further comprising depositing a protective layer over the polysilicon layer, and further comprising removing the protective layer prior to depositing the polysilicon.

12. The method of claim 9, wherein the first dual metal gate FET includes an n-type FET, and wherein the first work function adjusting material includes lanthanum oxide.

13. The method of claim 9, wherein the second dual metal gate FET includes a p-type FET, and wherein the second work function adjusting material includes aluminum oxide.

14. The method of claim 9, wherein the removing includes removing the second work function adjusting material and the second metal over the long channel active region and all of the first short channel active region.

\* \* \* \* \*